United States Patent
Cho

(10) Patent No.: US 7,427,325 B2
(45) Date of Patent: Sep. 23, 2008

(54) METHOD FOR PRODUCING HIGH QUALITY SILICON SINGLE CRYSTAL INGOT AND SILICON SINGLE CRYSTAL WAFER MADE THEREBY

(75) Inventor: Hyon-Jong Cho, Gumi (KR)

(73) Assignee: Siltron, Inc., Gumi (KR)

( * ) Notice: Subject to any disclaimer, the term of this patent is extended or adjusted under 35 U.S.C. 154(b) by 0 days.

(21) Appl. No.: 11/643,201

(22) Filed: Dec. 21, 2006

(65) Prior Publication Data

US 2007/0151505 A1 Jul. 5, 2007

(30) Foreign Application Priority Data

Dec. 30, 2005 (KR) .................. 10-2005-0135365
Oct. 19, 2006 (KR) .................. 10-2006-0101952

(51) Int. Cl.
*C30B 15/20* (2006.01)
(52) U.S. Cl. .................. 117/15; 117/13; 117/217; 117/218; 117/222
(58) Field of Classification Search .................. 117/13, 117/15, 217, 218, 222
See application file for complete search history.

(56) References Cited

U.S. PATENT DOCUMENTS

| 6,045,610 A | 4/2000 | Park et al. |
| 6,527,859 B2 | 3/2003 | Lee et al. |

FOREIGN PATENT DOCUMENTS

| JP | 02-119891 | 5/1990 |
| JP | 04-17542 | 1/1992 |
| JP | 05-061924 | 3/1993 |
| JP | H7-66074 | 3/1995 |
| JP | 07-158458 | 6/1995 |
| KR | 10-2001-0006182 | 1/2001 |
| KR | 10-2001-0006227 | 1/2001 |
| KR | 10-2001-0101045 | 11/2001 |
| KR | 10-2002-0082132 | 10/2002 |
| KR | 10-0374703 | 2/2003 |
| KR | 10-0411571 | 12/2003 |
| KR | 10-0508048 | 8/2005 |
| KR | 10-0588425 | 6/2006 |

OTHER PUBLICATIONS

Eidenzon et al., "Defect-free Silicon Crystals Grown by the Czochralski Technique, Inorganic Materials," vol. 33, No. 3, 1997, pp. 272-279.

*Primary Examiner*—Felisa C Hiteshew
(74) *Attorney, Agent, or Firm*—Greer, Burns & Crain, Ltd.

(57) ABSTRACT

In a method for producing a high quality silicon single crystal by the Czochralski method, a lower portion of a solid-liquid interface of a single crystal growth is divided into a central part and a circumferential part, and the temperature gradient of the central part and the temperature gradient of the circumferential part are separately controlled. When a silicon melt located at a lower portion of a solid-liquid interface of a single crystal growth is divided into a central part melt and a circumferential part melt, the method controls the temperature gradient of the central part melt by directly controlling the temperature distribution of a melt and indirectly controls the temperature gradient of the circumferential part melt by controlling the temperature gradient of the single crystal, thereby effectively controlling the overall temperature distribution of the melt, thus producing a high quality single crystal ingot free of defects with a high growth velocity.

7 Claims, 5 Drawing Sheets

METHOD FOR PRODUCING HIGH QUALITY SILICON SINGLE CRYSTAL INGOT AND SILICON SINGLE CRYSTAL WAFER MADE THEREBY

BACKGROUND OF THE INVENTION

1. Field of the Invention

The present invention relates to a method for producing a high quality silicon single crystal ingot free of point defects, and in particular, to a method for producing a high quality silicon single crystal ingot in which growth defects are controlled by controlling the temperature distribution of a melt when growing a silicon single crystal ingot by the Czochralski method.

2. Description of the Related Art

Conventional techniques have controlled the temperature distribution of a high temperature region of a single crystal ingot after crystallization so as to grow a high quality silicon single crystal ingot which may lead to increased yield of a semiconductor device. This intends to control stresses which are induced by shrinkage due to cooling after crystallization or to control the movement of point defects which occurred during solidification.

Generally, a method for producing a silicon single crystal ingot by the Czochralski method loads a polycrystalline silicon in a quartz crucible, melts the polycrystalline silicon by heat radiated from a heater into a silicon melt, and grows a silicon single crystal ingot from the surface of the silicon melt.

For growing a silicon single crystal ingot, the crucible is rotated by an axis which supports the crucible and is elevated upwardly so that a single crystal is coplanar with the surface of a melt. The silicon single crystal ingot is pulled up while being rotated in the opposite direction to the rotational direction of the crucible The grown silicon single crystal ingot goes through a series of wafer fabrication processes, for example slicing, lapping, polishing and cleaning processes, to form a silicon single crystal wafer for a semiconductor device substrate.

A prior art, for example U.S. Pat. No. 6,045,610, teaches a high quality ingot or wafer free of defects and a method for producing the same which control $\Delta(V/G)$ based on Voronkov's theory. According to Voronkov's theory, if a V/G ratio is above the critical point, a dominant point defect in a crystal is vacancy-rich, and if a V/G ratio is below the critical point, a dominant point defect in a crystal is interstitial-rich, where V is a pulling rate influencing a convection of a point defect in the silicon single crystal, and G is an instantaneous axial temperature gradient in the vicinity of an interface of a crystal melt influencing a diffusion of a point defect by forming the temperature gradient in a crystal.

If G is dominant (G is larger than V), a large temperature gradient leads to a large thermodynamic density gradient of a point defect, thus resulting in a large diffusion of point defect in a crystal direction. In this case, because mobility of interstitial defect is larger than that of vacancy defect, a dominant point defect becomes interstitial defect. On the contrary, if V is dominant (V is larger than G), the state that a vacancy concentration is large than an interstitial concentration at the crystal-melt interface maintains during the crystal growth due to convention occurred in the melt by pulling up a single crystal (because influence of G is trifle). Therefore, if a V/G ratio is above the critical point, vacancy-rich crystal ingot is generated, and if a V/G is below the critical point, interstitial-rich crystal ingot is generated.

Another prior arts, for example KR Patent Registration No. 374703, KR Patent Registration No. 411571 and U.S. Pat. No. 6,527,859, suggest an additional structure such as a heat shield for controlling an axial temperature gradient (G) of a growing silicon single crystal ingot in the radial direction of a crystal. The use of the heat shield is effective in controlling the temperature gradient of a circumferential part of a single crystal, but it has a limitation in controlling the temperature gradient of a central part of the single crystal.

Another prior art, for example KR Laid-open Patent Publication No. 2004-84728, discloses a method for producing a high quality ingot or wafer free of defects by controlling the temperature distribution in a melt using a co-rotation method that makes the rotational direction of a single crystal ingot and the rotational direction of a crucible equal. However, the co-rotation method has the drawback that the temperature distribution in a melt is deteriorated by various control factors and the control of oxygen concentration is difficult.

Another prior art has intended to control an axial temperature gradient by controlling various process parameters of a single crystal growth process. However, control of process parameters is insufficient for controlling an axial temperature gradient of a silicon single crystal ingot as desired. Further, the art has a difficulty in producing a high quality silicon single crystal ingot having a low point defect density with a high productivity.

A wafer substrate suitable for a device process preferably has few agglomerated defects other than point defects such as vacancy defects or self-interstitial defects in an active device region which is formed to several micro layers from a wafer surface.

Conventionally, as disclosed in KR Laid-open Patent Publication Nos. 2001-6182, 2001-6227 and 2001-6229, a vacancy concentration increases from a circumferential part towards a central part of a single crystal ingot, whereas an interstitial concentration decreases from the circumferential part towards the central part of the single crystal ingot, because a axial temperature gradient ($G_0$) of the crystal has the function of $G_0=c+ax^2$. An insufficient out-diffusion in the vicinity of the circumferential part of the single crystal ingot results in crystal defects of interstitial characteristic, for example a large dislocation pit (LDP), whereby a crystal growth is generally performed in the state of a high vacancy concentration of the central part. As a result, crystal defects, for example voids or oxidation induced stacking faults (OiSFs), occur in a central part of a wafer where the vacancy concentration is much higher than an equilibrium concentration. However, reduction of a cooling rate of a crystal for a sufficient interstitial out-diffusion may require an additional hot zone. Further, it may reduce a growth velocity of a single crystal ingot, thereby decreasing productivity.

Another prior arts teach controlling the temperature distribution of a silicon single crystal ingot for producing a high quality silicon single crystal ingot. For example, JP Patent Application H2-119891 discloses controlling the temperature distribution of a central part and a circumferential part of a silicon single crystal ingot employing a hot zone of a high temperature region during cooling a single crystal, thereby reducing lattice defects of a silicon single crystal ingot caused by strain of solidification. This art intends to increase a solidification rate in the growth direction of a single crystal while reducing lattice defects by a cooling sleeve. JP Patent Application H7-158458 discloses controlling the temperature distribution in a crystal and a pulling rate of the crystal. JP Patent Application H7-66074 discloses controlling the defect density by improving a hot zone and controlling a cooling rate. JP Patent Application H4-17542 and KR Laid-open Patent Publication No. 2001-6229 disclose changing a hot zone and controlling the cooling rate to prevent formation of crystal defects by diffusion of point defects. KR Laid-open Patent Publication No. 2002-82132 discloses improving a heat shield and a water cooling tube to increase productivity of a high quality single crystal.

However, because these arts are based on a solid state reaction, the arts have following drawbacks. First, the arts have various limitations in achieving a high quality silicon single crystal. For example, KR Laid-open Patent Publication No. 2001-6229 discloses reducing the point defect density by sufficient diffusion reaction of supersaturated point defects at a high temperature region before the supersaturated point defects are grown to crystal defects. However, the art requires the temperature maintenance time of 16 hours or more, which is possible only in theory but not applicable in practice.

Second, the arts do not have substantial effects. As proposed in JP Patent Application H5-61924 and Eidenzon et al., titled "Defect-free Silicon Crystals Grown by the Czochralski Technique, Inorganic Materials", Vol. 33, No. 3, 1997, pp. 272-279, an attempt was made to grow a 200 mm silicon single crystal ingot while periodically changing a pulling rate of a crystal, but a desired quality of a silicon single crystal ingot could not be obtained and further a single crystal growth process was instable.

Third, an invention based only on a solid state reaction theory cannot achieve a high productivity. For example, KR Laid-open Patent Publication No. 2001-101045 has designed optimum heat shield and water cooling tube, however, a pulling rate is in practical about 0.4 mm/min, thereby resulting in a low productivity.

Further, the above-mentioned arts have a low productivity of a high quality single crystal.

SUMMARY OF THE INVENTION

The present invention is designed to solve the problems of the prior arts. While researching a method for controlling the temperature distribution of a melt, the inventor has found that the temperature distribution of the melt may be effectively controlled when the temperature gradient of the melt and the temperature gradient of a single crystal are controlled separately, and then completed this invention.

Therefore, it is a main object of the present invention to provide a method for producing a high quality silicon single crystal which controls factors directly influencing the temperature gradient of a melt while indirectly controlling the temperature gradient of the melt by controlling the temperature gradient of a single crystal, thereby effectively controlling the temperature distribution of the melt.

It is an object of the present invention to provide a method for producing a high quality silicon single crystal, in which a silicon melt located at a low portion of a solid-liquid interface is divided into a central part melt and a circumferential part melt, and the temperature gradient of the central part melt is controlled by directly controlling the temperature gradient of the melt, thereby effectively controlling the temperature distribution of the melt.

It is another object of the present invention to provide a method for producing a high quality silicon single crystal, in which a silicon melt located at a low portion of a solid-liquid interface is divided into a central part melt and a circumferential part melt and the temperature gradient of the circumferential part melt is controlled by controlling the temperature gradient of the single crystal, thereby effectively controlling the temperature distribution of the melt.

It is another object of the present invention to provide a method for producing a high quality silicon single crystal, in which a high quality single crystal ingot free of defects may be produced at a high pulling rate of about 0.65 mm/min.

It is another object of the present invention to provide a method for producing a high quality silicon single crystal which solves the problem of the prior arts, that is a low productivity of a high quality single crystal.

According to the exemplary embodiments of the present invention, a method for producing a high quality silicon single crystal by the Czochralski method divides a low portion of a solid-liquid interface of a single crystal growth into a central part and a circumferential part, and separately controls the temperature gradient of a central part melt and the temperature gradient of a circumferential part melt. An interface point between the central part and the circumferential part is located at ⅔R (R is a radius of a single crystal) from the center of the solid-liquid interface.

According to the exemplary embodiments of the present invention, the temperature gradient of the circumferential part melt is controlled by controlling the temperature gradient of the single crystal. Preferably, the temperature gradient of the single crystal is controlled by controlling a gap between a heat shield and the surface of the single crystal (hereinafter referred to as a gap of a heat shield). Preferably, the gap of the heat shield is between 10 and 50 mm.

According to the exemplary embodiments of the present invention, the temperature gradient of the central part melt is controlled by directly controlling the temperature gradient of the melt. Preferably, the temperature gradient of the melt is controlled by controlling a ratio of a rotation rate of the single crystal ingot to a rotation rate of a crucible.

According to the exemplary embodiments of the present invention, assuming the rotation rate of the silicon single crystal ingot is Vs and the rotation rate of the crucible containing the melt is Vc, the ratio of the rotation rate of the silicon single crystal ingot to the rotation rate of the crucible satisfies the following equation: $3<\mathrm{Ln}[Vs/Vc]\leqq 5$.

According to the exemplary embodiments of the present invention, the ratio (r) of the rotation rate of the single crystal to the rotation rate of the crucible and the gap (g) of the heat shield satisfy the following equation:

$$\frac{1}{g} = \frac{2}{g_0} \frac{(r/r_0)^c}{1+(r/r_0)^{2c}}$$

wherein $r_0$ is a ratio of the rotation rate of the silicon single crystal to the rotation rate of the crucible when the defect-free pulling rate is maximum, and $g_0$ is a gap of the heat shield when the defect-free pulling rate is maximum.

Preferably, c in the equation is between 0.2 and 1, and more preferably, is between 0.3 and 0.5.

According to the exemplary embodiments of the present invention, a silicon wafer is manufactured by the high quality silicon single crystal ingot produced by any one of the above methods.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

The present invention is devised from the fact that controlling of the axial temperature gradient of a single crystal ingot and the shape of a solid-liquid interface has a limitation in growing a high quality silicon single crystal ingot having minimum point defects, and there are more critical factors for growing a high quality silicon single crystal ingot.

The inventor has thoroughly analyzed a fluid state before solidification in order to overcome a limitation of prior arts based on a solid state reaction after crystallization, and then concluded the temperature distribution of a melt as an important factor.

Generally, during crystal growth, a growth unit in the form of an atom or a molecule is moved to a crystal growth interface or a metastable region and fixed at the crystal growth interface. As the temperature inclination of a silicon melt increases, a driving force that the crystal growth unit of a fluid state moves to the crystal growth interface or the metastable region increases.

Here, the crystal growth interface is also called a crystallization interface or a solid-liquid interface and is an interface where a solid state silicon single crystal ingot meets with a liquid state silicon melt. The metastable region is a region which is in a state immediately before a liquid state silicon melt is crystallized, but is in an incomplete crystallization state.

Therefore, a high temperature inclination in the silicon melt leads to a high crystal growth participation of a growth unit. Thereby, if a pulling rate of a crystal is not sufficiently high, excessive atoms are crystallized, thus resulting in a silicon single crystal ingot of self-interstitial rich characteristic. On the contrary, if a temperature inclination in a silicon solution is low, atoms to be crystallized are insufficient, thus resulting in a silicon single crystal ingot of vacancy rich characteristic.

Figure 1:
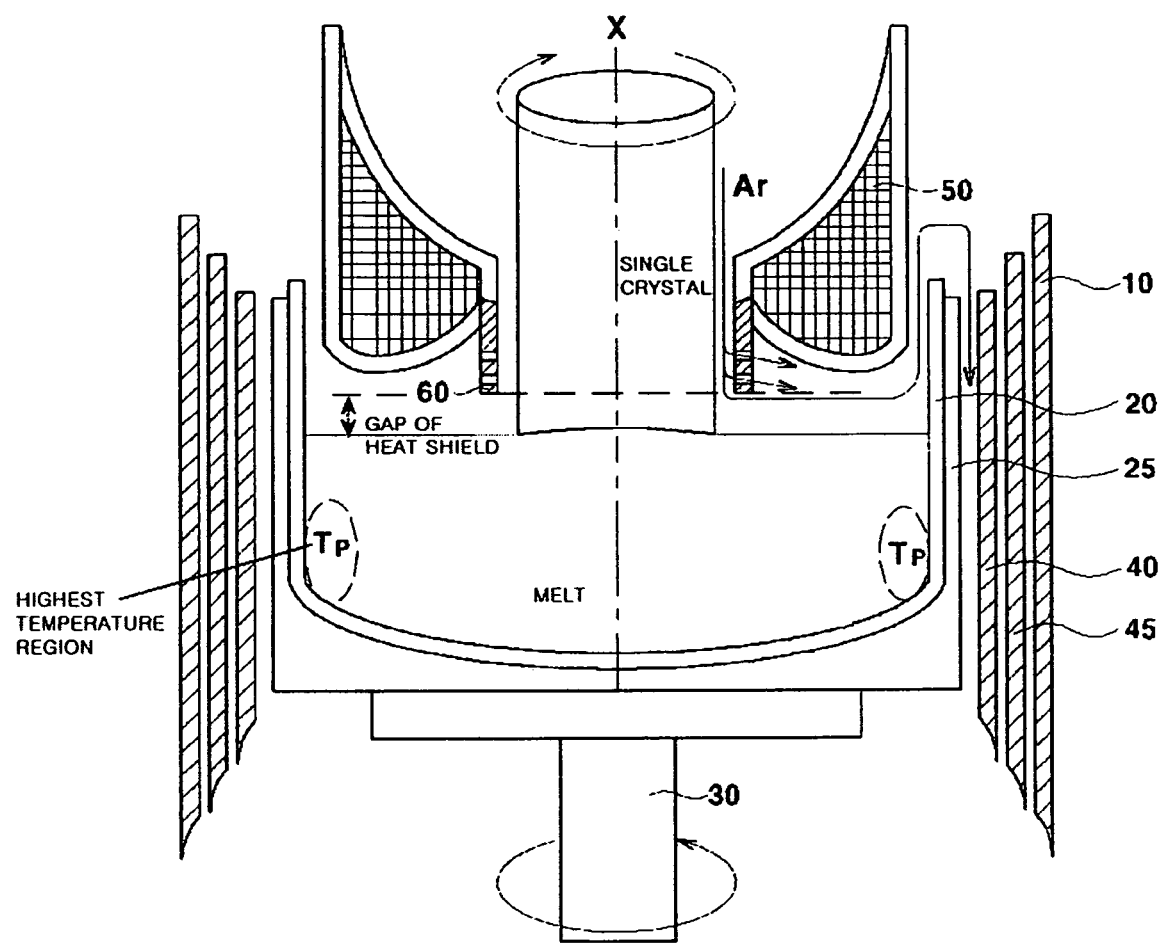
FIG. 1 is a cross-sectional view of an apparatus for growing a high quality silicon single crystal ingot by the Czochralski method in accordance with an exemplary embodiment of the present invention.

FIG. 1 is a cross-sectional view of an apparatus for growing a high quality silicon single crystal ingot by the Czochralski method in accordance with an exemplary embodiment of the present invention. As shown in FIG. 1, a silicon single crystal ingot (IG) according to this exemplary embodiment is grown in a chamber 10.

In the chamber 10, a quartz crucible 20 containing a silicon melt (SM) is installed. A crucible support 25 is made of graphite and surrounds the crucible 20. At this time, the crucible support 25 is fixed on a rotational axis 30, and the rotational axis 30 is rotated by a driving means (not shown) to rotatably elevate the quartz crucible 20 so that the single crystal ingot (IG) is coplanar with the surface of the silicon melt (SM). A heater 40 surrounds the crucible support 25 at a predetermined distance. A thermos 45 surrounds the heater 40.

The heater 40 is configured to melt a high-purity polycrystalline silicons loaded in the quartz crucible 20 into the silicon melt (SM). The radiation shield 45 is configured to prevent heat radiated from the heater 40 from being transferred to walls of the chamber 10, thereby improving a thermal efficiency.

A heat shield 50 is installed between the ingot (IG) and the crucible 20 and surrounds the ingot (IG), and is configured to shield heat radiated from the ingot (IG). At this time, a heat shielding unit 60 formed in the shape of a cylinder may be installed at a most adjacent region of the ingot (IG) from the heat shield 50, and is configured to shield a heat flow and preserve heat.

In addition, a pulling means (not shown) is installed at an upper portion of the chamber 10 for pulling up the ingot (IG) using a cable. A seed crystal is installed at a lower portion of the cable and is used in growing the single crystal ingot (IG) by pulling up the seed crystal while keeping a contact with the silicon melt (SM) in the quartz crucible 20. The pulling means rotates in the opposite direction to rotation of the crucible 20 when growing the single crystal ingot (IG) by pulling up the silicon single crystal ingot (IG).

Inert gas, for example argon (Ar) or nitrogen (N), is provided to the growing single crystal ingot (IG) and the silicon melt (SM) through the upper portion of the chamber 10 and the used inert gas is discharged through the lower portion of the chamber 10.

According to an exemplary embodiment of the present invention, a method for producing a high quality silicon single crystal by the Czochralski method divides a lower portion of a solid-liquid interface of a single crystal growth into a central part and a circumferential part, and separately controls the temperature gradient of a central part melt and the temperature gradient of a circumferential part melt. Here, an interface location between the central part and the circumferential part is ⅔ R(R is a radius of a single crystal ingot) from the center of the solid-liquid interface.

At this time, the temperature gradient of the central part melt is preferably controlled by controlling the temperature gradient of a melt and the temperature gradient of the circumferential part melt is preferably controlled by controlling the temperature gradient of the single crystal.

As mentioned above, effective control of the temperature distribution of the melt is important to produce a high quality single crystal ingot free of defects at a high growth velocity. In order to effectively control the temperature distribution of the melt, it is preferred to control factors directly influencing the temperature gradient of the melt or to indirectly control the temperature gradient of the melt by controlling the temperature gradient of the single crystal. Thus, when a silicon melt located at the lower portion of the solid-liquid interface is divided into the central part melt and the circumferential part melt, it is preferred to directly control the temperature gradient of the central part melt by controlling the temperature distribution of the melt and to indirectly control the temperature gradient of the circumferential part melt by controlling the temperature gradient of the single crystal.

Dominant point defects on growing a silicon single crystal ingot are determined by a pulling rate of the single crystal and the temperature gradient of a growth system. In addition, because the temperature gradient of the growth system is a value in the vicinity of the solid-liquid interface, the temperature gradient is influenced by the temperature gradient in the crystal and the temperature gradient in the melt. This will be proved by a heat balance equation based on the following equation 1. The temperature gradient of the single crystal is proportional to the temperature gradient of the melt.

$$k_S G_S = k_L G_L + L_f V \qquad \text{Equation 1}$$

$k_S$: a solid (single crystal) heat transfer coefficient
$G_S$: a solid (single crystal) temperature gradient
$k_L$: a liquid (melt) heat transfer coefficient
$G_L$: a liquid (melt) temperature gradient
$L_f$: a crystallization latent heat
V: a growth velocity Therefore, the temperature gradient of the single crystal is influenced by type or material of a heat shield as well as the gap of the heat shield. For example, if the gap of the heat shield is reduced, more heat is deprived from the circumference of the crystal. As a result, the temperature gradient of the circumferential part of the crystal increases and then a defect-free pulling rate increases.

Preferably, the temperature gradient of the single crystal is controlled by controlling the gap of the heat shield. At this time, the gap of the heat shield is preferably between 10 and 50 mm.

Figure 2:
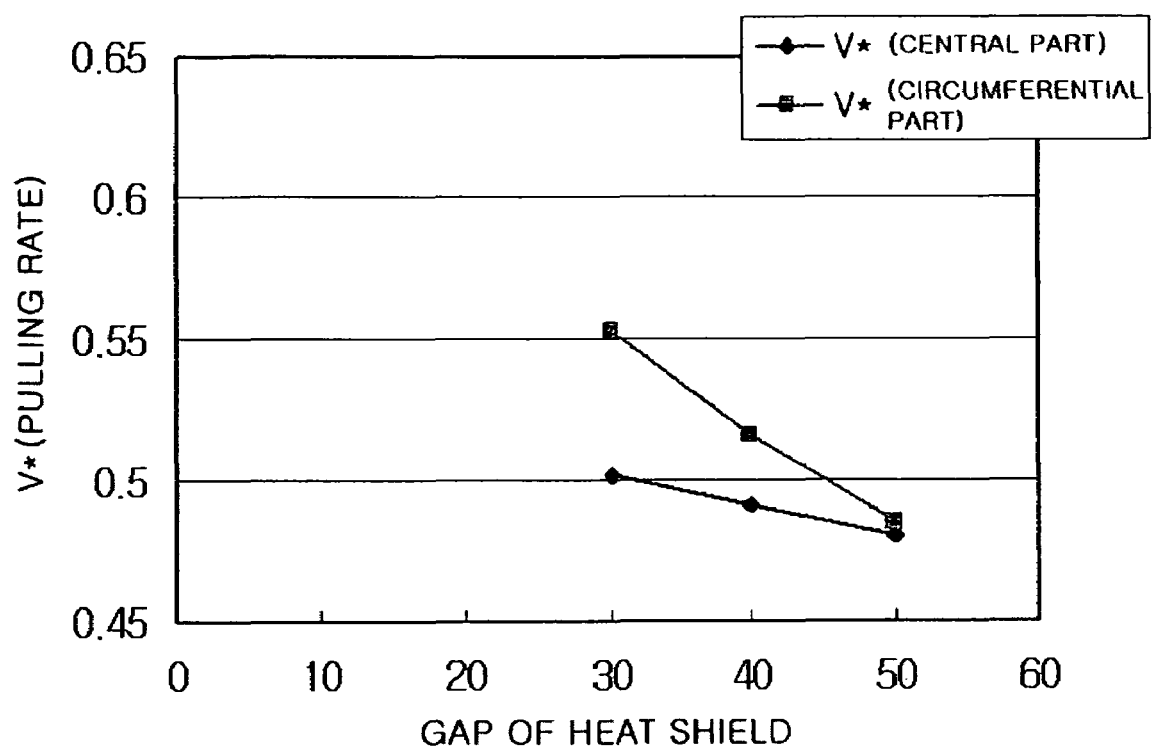
FIG. 2 is a graph of defect-free pulling rates of a circumferential part and a central part of a single crystal according to the change of a gap of a heat shield in accordance with an exemplary embodiment of the present invention.

FIG. 2 is a graph of defect-free pulling rates of the circumferential part and the central part of the single crystal according to the change of the gap of the heat shield in accordance with an exemplary embodiment of the present invention. Referring to FIG. 2, it is noted that a defect-free pulling rate of the circumferential part of the single crystal is more sensitively influenced by the gap of the heat shield, whereas the defect-free pulling rate of the central part of the single crystal is less sensitively influenced by the gap of the heat shield. Therefore, it is found that control of the temperature gradient of the single crystal according to the change of the gap of the heat shield is an effective means for controlling the temperature gradient of the circumferential part of a single crystal growth system.

Preferably, the temperature gradient of the melt is controlled by controlling a ratio of the rotation rate of the single crystal to the rotation rate of the crucible. Because control of the temperature gradient of the melt should take convection of the melt into consideration, control of the temperature gradient of the melt is relatively more complicate than control of the temperature gradient of the single crystal.

Assuming that the rotation rate of the crucible containing the melt is Vc and the rotation rate of the silicon single crystal ingot is Vs, the inventor has found that it is preferable that a ratio of the rotation rate of the silicon single crystal ingot to the rotation rate of the crucible satisfies the following equation:

$$3 \leq \ln[Vs/Vc] \leq 5$$

Preferably, ln[Vs/Vc] is between 3.5 and 4.5.

Figure 3:
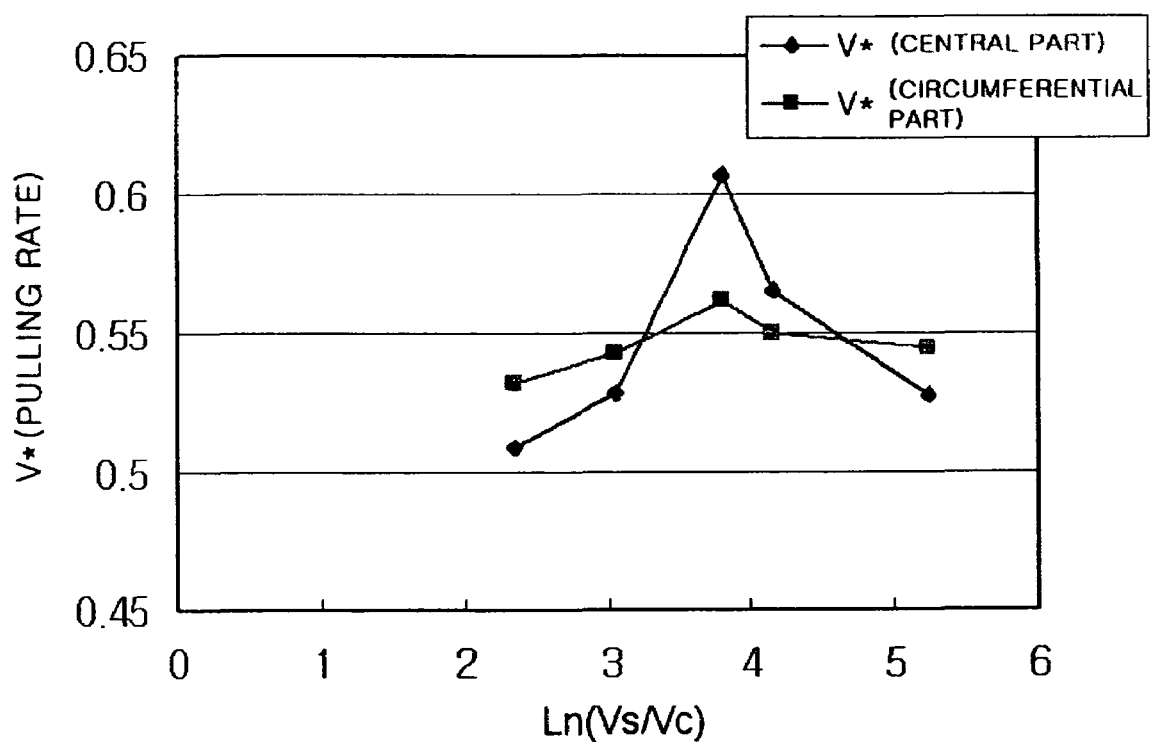
FIG. 3 is a graph of defect-free pulling rates of the circumferential part and the central part of the single crystal according to a ratio of a rotation rate (Vs) of the single crystal to a rotation rate (Vc) of a crucible in accordance with an exemplary embodiment of the present invention.
Figure 4:
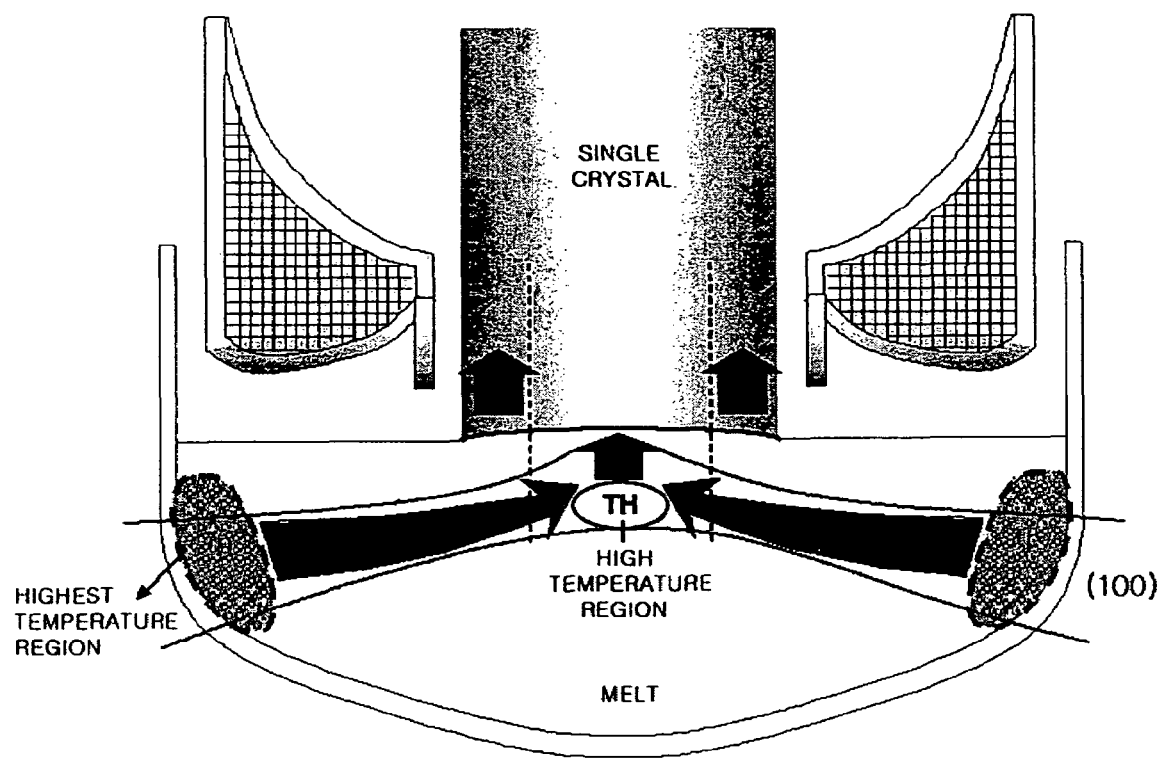
FIG. 4 is a schematic view showing that the ratio of the rotation rate (Vs) of the single crystal to the rotation rate (Vc) of the crucible influences the temperature gradients of the circumferential part and the central part of the melt and the single crystal in accordance with another exemplary embodiment of the present invention.

FIG. 3 is a graph of defect-free pulling rates of the circumferential part and the central part of the single crystal according to the ratio of the rotation rate (Vs) of the single crystal to the rotation rate (Vc) of the crucible in accordance with an exemplary embodiment of the present invention. FIG. 4 is a schematic view conceptionally showing how the ratio of the rotation rate (Vs) of the single crystal to the rotation rate (Vc) of the crucible influences the temperature gradients of the circumferential part and the central part of the melt and the single crystal in accordance with another exemplary embodiment of the present invention.

Referring to FIG. 3, it is found that, as ln[Vs/Vc] increases, a growth velocity of the high quality single crystal increases, and after a predetermined point it decreases. The reason is that if the rotation rate of the single crystal becomes excessively large in comparison to the rotation rate of the crucible, a cold melt moving upwards from a bottom of the crucible reduces the temperature of a high temperature region, thereby reducing the vertical temperature inclination of the melt.

More specifically, if ln[Vs/Vc] is within the above-mentioned numerical range, heat of a highest temperature region is effectively transferred to the lower portion of the solid-liquid interface due to a channel effect. The channel effect means that heat is transferred along a channel 100 from the highest temperature region towards a high temperature region with minimum heat loss. Due to the channel effect, the temperature inclination of the melt from the solid-liquid interface to the high temperature region (the temperature increases from the solid-liquid interface to the high temperature region) increases, thereby obtaining a defect-free pulling rate of a desired range.

In addition, referring to FIG. 3, it is noted that the defect-free pulling rate of the central part rapidly increases in the vicinity of ln[Vs/Vc]=3.8, whereas the defect-free pulling rate of the circumferential part is less active according to the change of ln[Vs/Vc]. Therefore, it will be understood that control of the temperature gradient in the melt according to the change of ln[Vs/Vc] is an effective means for controlling the temperature gradient of the central part melt of the crystal growth system.

Meanwhile, if ln[Vs/Vc] is between 3 and 5, the temperature inclination of the melt at the lower portion of the solid-liquid interface increases due to the channel effect. However, when the temperature distribution of the melt is extended beyond an edge portion of the silicon single crystal, the temperature variation decreases in a radial direction of the silicon single crystal. As a result, a horizontal growth of the crystal is more dominant at the edge portion of the single crystal than a vertical growth of the crystal, thereby resulting in the likelihood of an abnormal crystal growth, for example, a flower phenomenon. In order to solve the problem, it is preferred to increase the horizontal temperature inclination at the outside of the edge portion of the silicon single crystal by controlling the gap of the heat shield, the rotation rate of the single crystal, or a magnetic field distribution used during the growth of the silicon single crystal.

Preferably, according to the method for producing a high quality silicon single crystal by the Czochralski method, the ratio (r) of the rotation rate (Vs) of the single crystal to the rotation rate (Vc) of the crucible and the gap (g) of the heat shield satisfy the following equation 2 for growing the high quality silicon single crystal.

In the following equation 2, $r_0$ is a ratio of the rotation rate of the silicon single crystal to the rotation rate of the crucible when the defect-free pulling rate is maximum, and $g_0$ is a gap of the heat shield when the defect-free pulling rate is maximum. In the following equation 2, c is preferably between 0.2 and 1, and more preferably is between 0.3 and 0.5.

$$\frac{1}{g} = \frac{2}{g_0} \frac{(r/r_0)^c}{1+(r/r_0)^{2c}} \qquad \text{Equation 2}$$

Figure 5:
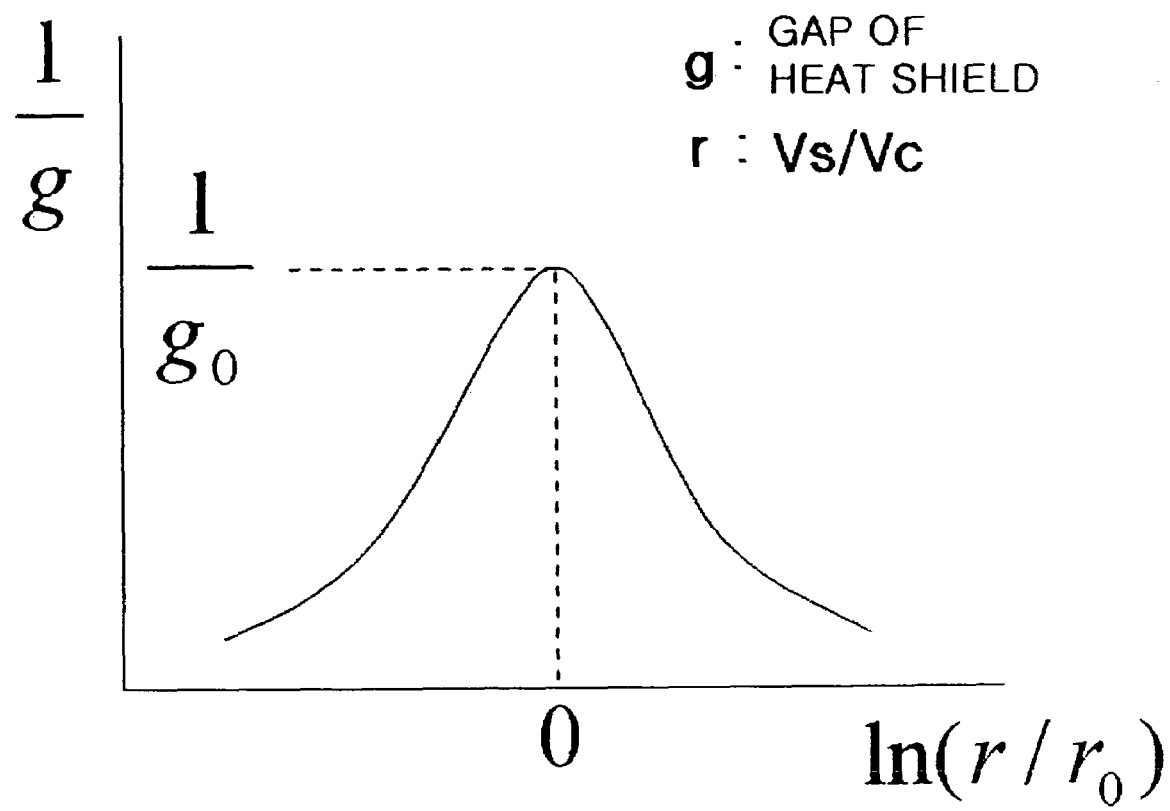
FIG. 5 is a graph showing the relation between the ratio (r) of the rotation rate of the single crystal to the rotation rate of the crucible and the gap (g) of the heat shield for growing a defect-free silicon crystal in accordance with an exemplary embodiment of the present invention.

FIG. 5 is a graph of the above equation 2 with ln $r/r_0$ as an X-axis and g/1 as a Y-axis, when c=1. For example, if c is larger than 1, the graph becomes broad relative to X=0, and if c is smaller than 1, the graph becomes narrow relative to X=0.

Preferably, in order to grow a defect-free silicon single crystal, a defect-free pulling rate of the central part of the single crystal is equal to a defect-free pulling rate of the circumferential part of the single crystal. Therefore, the value of r and the value of g should be selected such that the defect-free pulling rate of the circumferential part is increased as much as an increase of the defect-free pulling rate of the central part. In addition, the value of r and the value of g should be selected such that the defect-free pulling rate of the circumferential part is reduced as much as a reduction of the defect-free pulling rate of the central part. FIG. 5 is a graph made by the value of r and the value of g satisfying such condition. The equation 2 expressing the relation of r and g is devised by interpreting data shown in graphs of FIGS. 2 and 3 and numerically analyzing it using a computer so that the defect-free pulling rate of the central part of the silicon single crystal is equal to the defect-free pulling rate of the circumferential part of the silicon single crystal.

A graph of FIG. 5 has the following interpretations. If the value of r approaches $r_0$, the defect-free pulling rate of the central part of the silicon single crystal and the defect-free pulling rate of the circumferential part of the silicon single crystal increase as shown in FIG. 3, but their increasing ranges are not equal to each other. In other words, the increasing range of the defect-free pulling rate of the central part of the silicon single crystal is larger than that of the circumferential part of the silicon single crystal. Meanwhile, as shown in FIG. 5, as the value of r approaches $r_0$, the gap (g) of the heat shield reduces. However, if the value of g reduces, the defect-free pulling rate of the central part of the silicon single crystal and the defect-free pulling rate of the circumferential part of the silicon single crystal increase as shown in FIG. 2, but the increasing range of the defect-free pulling rate of the circumferential part of the silicon single crystal is larger than that of the central part of the silicon single crystal. Therefore, a relatively low pulling rate of the circumferential part of the silicon single crystal as the value of r approaching $r_0$ is compensated by controlling the gap (g) of the heat shield so that the defect-free pulling rate of the central part of the silicon single crystal is equal to the defect-free pulling rate of the circumferential part of the silicon single crystal, thereby allowing for growth of a high quality silicon single crystal.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

APPLICABILITY TO THE INDUSTRY

A method for producing a high quality silicon single crystal and a silicon single crystal wafer manufactured by using the silicon single crystal ingot produced by the method according to the present invention have the following effects.

The method for producing a high quality silicon single crystal according to the present invention effectively controls the temperature distribution of a melt to produce a high quality single crystal ingot free of defects at a high growth velocity.

According to the present invention, the temperature gradient of the melt is controlled by controlling factors directly influencing the temperature gradient of the melt and further controlling the temperature gradient of a single crystal indirectly influencing the temperature gradient of the melt, thereby resulting in a high productivity.

That is to say, the method for producing a high quality silicon single crystal according to the present invention divides a silicon melt located at a lower portion of a solid-liquid interface into a central part melt and a circumferential part melt, and controls the temperature gradient of the central part melt by directly controlling the temperature gradient of the melt and indirectly controls the temperature gradient of the circumferential part melt by controlling the temperature gradient of the single crystal, thereby producing a high quality single crystal ingot free of defects at a high growth velocity, for example about 0.65 mm/min.

The method for producing a high quality silicon single crystal according to the present invention may solve the problem of prior arts, that is a low productivity of a high quality single crystal.

What is claimed is:

1. A method for producing a high quality silicon single crystal ingot by the Czochralski method,
   wherein a lower portion of a solid-liquid interface of a single crystal growth is divided into a central part and a circumferential part, and the temperature gradient of a central part melt is controlled by controlling a ratio of a rotation rate of the single crystal to a rotation rate of a crucible, and the temperature gradient of a circumferential part melt is separately controlled by controlling a gap of a heat shield.

2. The method of claim 1,
   wherein the temperature gradient of the circumferential part melt is controlled by controlling the temperature gradient of a single crystal.

3. The method of claim 1,
   wherein the gap of the heat shield is between 10 and 50 mm.

4. The method of claim 1,
   wherein, assuming the rotation rate of the crucible containing the melt is Vc and the rotation rate of the silicon single crystal is Vs, the ratio of the rotation rate of the silicon single crystal to the rotation rate of the crucible satisfies the following equation: $3 \leq \ln[Vs/Vc] \leq 5$.

5. A method for producing a high quality silicon single crystal by the Czochralski method,
   wherein a ratio (r) of a rotation rate of a single crystal to a rotation rate of a crucible and a gap (g) of a heat shield satisfy the following equation:

$$\frac{1}{g} = \frac{2}{g_0} \frac{(r/r_0)^c}{1 + (r/r_0)^{2c}}$$

wherein $r_0$ is a ratio of the rotation rate of the silicon single crystal to the rotation rate of the crucible when the defect-free pulling rate is maximum, and $g_0$ is a gap of the heat shield when the defect-free pulling rate is maximum.

6. The method of claim 5,
   wherein c in the equation is between 0.2 and 1.

7. The method of claim 5,
   wherein c in the equation is between 0.3 and 0.5.

* * * * *